(12) United States Patent
Tendou et al.

(10) Patent No.: US 7,981,977 B2
(45) Date of Patent: Jul. 19, 2011

(54) SEALANT FOR ELECTRONICS OF EPOXY RESIN, AROMATIC AMINE, ACCELERATOR AND INORGANIC FILLER

(75) Inventors: Kazuyoshi Tendou, Tokyo (JP); Satoru Tsuchida, Ibaraki (JP); Shinsuke Hagiwara, Ibaraki (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 422 days.

(21) Appl. No.: 12/096,445

(22) PCT Filed: Dec. 8, 2006

(86) PCT No.: PCT/JP2006/324566
§ 371 (c)(1),
(2), (4) Date: Jun. 6, 2008

(87) PCT Pub. No.: WO2007/066763
PCT Pub. Date: Jun. 14, 2007

(65) Prior Publication Data
US 2009/0273070 A1 Nov. 5, 2009

(30) Foreign Application Priority Data

Dec. 8, 2005 (JP) ................................ 2005-354719
Dec. 8, 2005 (JP) ................................ 2005-354720
Dec. 8, 2005 (JP) ................................ 2005-354721

(51) Int. Cl.
*C08K 3/36* (2006.01)
*C08L 63/00* (2006.01)
*C08L 63/02* (2006.01)
*H01L 23/29* (2006.01)

(52) U.S. Cl. ........ 525/476; 257/791; 257/793; 523/445; 523/455; 523/456; 523/457; 523/458; 523/459; 523/466; 523/467

(58) Field of Classification Search ........................ None
See application file for complete search history.

(56) References Cited

U.S. PATENT DOCUMENTS

| | | | |
|---|---|---|---|
| 5,985,954 A * | 11/1999 | Tsuchida et al. | 523/400 |
| 6,632,881 B1 * | 10/2003 | Tsuchida et al. | 525/65 |
| 6,725,931 B2 * | 4/2004 | Nguyen et al. | 166/280.2 |
| 6,733,902 B2 | 5/2004 | Sumita et al. | |
| 6,787,614 B2 * | 9/2004 | Takano et al. | 525/476 |
| 2005/0152773 A1 * | 7/2005 | Sumita et al. | 414/664 |

FOREIGN PATENT DOCUMENTS

| | | | |
|---|---|---|---|
| JP | 02-189357 | | 7/1990 |
| JP | 08-157695 | | 6/1996 |
| JP | 2000-336244 | | 12/2000 |
| JP | 2000-336244 A * | | 12/2000 |
| JP | 2001-270976 | | 10/2001 |
| JP | 2002-128866 | | 5/2002 |
| JP | 2002-128866 A * | | 5/2002 |
| JP | 2002-322343 | | 11/2002 |
| JP | 2003-055439 | | 2/2003 |
| JP | 2003-55439 A * | | 2/2003 |
| JP | 2003-128875 | | 5/2003 |
| JP | 2004-99810 A * | | 4/2004 |
| JP | 2004-346232 A * | | 12/2004 |
| JP | 2005-036069 | | 2/2005 |
| JP | 2005-146104 A * | | 6/2005 |
| JP | 2005-350618 | | 12/2005 |
| JP | 2007-182560 | | 7/2007 |
| JP | 2007-182561 | | 7/2007 |
| JP | 2007-182562 | | 7/2007 |

OTHER PUBLICATIONS

S. Zhengguang, et al., "Preparation and Application of Organosilicone Surfactants", *New Chemical Materials*, 2001, 29(3), pp. 10 and 11.

* cited by examiner

*Primary Examiner* — Robert Sellers
(74) *Attorney, Agent, or Firm* — Antonelli, Terry, Stout & Kraus, LLP.

(57) ABSTRACT

The invention relates to a liquid resin composition for electronic components which is used in sealing of electronic components, comprising a liquid epoxy resin, a curing agent containing a liquid aromatic amine, and an inorganic filler, and further comprising at least one member selected from a hardening accelerator, silicone polymer particles, and a nonionic surfactant. There is thereby provided a liquid resin composition for electronic components, which is excellent in fluidity in narrow gaps, is free of void generation, is excellent in adhesiveness and low-stress characteristic and is excellent in fillet formation, as well as an electronic component device having high reliability (moisture resistance, thermal shock resistance), which is sealed therewith.

10 Claims, No Drawings

SEALANT FOR ELECTRONICS OF EPOXY RESIN, AROMATIC AMINE, ACCELERATOR AND INORGANIC FILLER

TECHNICAL FIELD

The present invention relates to a liquid resin composition for electronic components, which is suitable particularly for sealing electronic component devices requiring strict reliability, as well as an electronic component device comprising an element sealed with the composition.

BACKGROUND ART

Conventionally, resin sealing has prevailed in the field of element sealing for electronic component devices such as transistors, IC etc., from the viewpoint of productivity, costs, etc., and epoxy resin compositions are widely used. This is because the epoxy resin is well-balanced in characteristics such as workability, formability, electrical characteristics, moisture resistance, heat resistance, mechanical characteristics, adhesiveness to an insert material, etc. In semiconductor devices having bare chips mounted thereon, such as COB (Chip on Board), COG (Chip on Glass), TCP (Tape Carrier Package) etc., liquid resin compositions for electronic components are widely used as sealing materials. In a semiconductor device (flip chip) having a semiconductor element bump-bonded directly onto a wiring substrate having ceramics, a glass/epoxy resin, a glass/imide resin, a polyimide film or the like as a substrate, a liquid resin composition for electronic components is used as an underfill material for filling a gap between the bump-bonded semiconductor element and the wiring substrate. Such a liquid resin composition for electronic components plays an important role in protecting electronic components from temperature and moisture and mechanical external force.

For providing a sealing epoxy resin composition excellent in moisture-resistant adhesion and low stress characteristic and an electronic component device having high reliability (moisture resistance, thermal shock resistance) provided with a component sealed therewith, there are disclosed a sealing epoxy resin composition comprising (A) a liquid epoxy resin, (B) a curing agent containing a liquid aromatic amine, (C) rubber particles and (D) an inorganic filler, and an electronic component device comprising an element sealed with the sealing epoxy resin composition (see, for example, Japanese Patent Application Laid-Open No. 2001-270976).

DISCLOSURE OF INVENTION

However, advances in semiconductors are remarkable, and as the number of bumps is increased in a flip-chip system with bump connection, bump pitch and bump height are decreased resulting in narrower gaps. In addition, chips are increased in size in accordance with higher integration, thus requiring an underfill material to have a property of flowing on a large area in narrow gaps thereon.

As gaps become narrower, the number of bumps is increased and bump pitch also becomes narrower, thus making a flow pathway of an underfill material complicated to permit voids to be easily generated. The underfill material after filling a gap between a wiring substrate and a semiconductor element is exuded in a predetermined amount around the semiconductor element to form a fillet. When the shape of the fillet is uneven, the fillet may be cracked during heat cycle or released from the substrate or the semiconductor element. Such void generation and uneven fillet formation can exert a significant influence on the reliability of flip-chip semiconductor devices.

An important role of the underfill material is to dissipate stress generated between a semiconductor element and a wiring substrate different from each other in coefficient of expansion, thereby maintaining the reliability of bump connection. But as the size of semiconductor elements is increased with decreasing gaps, it is becoming difficult for the conventional underfill material to maintain the reliability of bump connection. Particularly from the viewpoint of environmental protection, lead-free solder is increasingly used in bumps, but this lead-free solder is more mechanically brittle than conventional lead solder, thus making it more difficult to maintain the reliability of bump connection. For maintaining the reliability of bump connection, it is necessary to maintain excellent adhesiveness between a semiconductor element and a wiring substrate, thereby dissipate the stress generated therebetween. The stress generated in the interface between the semiconductor element and the underfill material leads to a breakdown in the semiconductor element. Particularly with the speed-up of semiconductor elements, a significant reduction in the stress is required for the underfill material because in semiconductor elements using a low-dielectric material such as black diamond in an interlayer dielectric layer, the interlayer dielectric layer is brittle.

As the underfill material shown above as an example, a liquid resin composition for electronic components is required to solve various problems accompanying advances in semiconductors. The present invention was made in light of these circumstances, and the object of the present invention is to provide a liquid resin composition for electronic components, which is excellent in fluidity in narrow gaps, is free of void generation, is excellent in adhesiveness and low-stress characteristic, to an element of an electronic component and is excellent in fillet formation, as well as an electronic component device having high reliability (moisture resistance, thermal shock resistance), which is sealed therewith.

The present inventors made extensive study for solving the above problem, and as a result, they found that a curing agent containing a liquid aromatic amine, and a hardening accelerator or a surfactant, can be used to achieve the above object such as moisture-resistant adhesiveness, and also that silicone polymer particles can be used as a low-stress agent to attain an excellent low-stress effect together with excellent reliability, to achieve the above object, and the present invention was thereby completed.

The present invention relates to the following (1) to (17):

(1) A liquid resin composition for electronic components which is used in sealing of electronic components, comprising (A) a liquid epoxy resin, (B) a curing agent containing a liquid aromatic amine, (C) a hardening accelerator, and (D) an inorganic filler.

(2) The liquid resin composition for electronic components according to the above-mentioned (1), wherein the hardening accelerator as the component (C) is an imidazole derivative.

(3) The liquid resin composition for electronic components according to the above-mentioned (1), wherein the hardening accelerator as the component (C) is an imidazole derivative having a phenyl group and a hydroxyl group as substituents.

(4) The liquid resin composition for electronic components according to the above-mentioned (2), wherein the imidazole derivative is a microencapsulated imidazole derivative.

(5) The liquid resin composition for electronic components according to the above-mentioned (3), wherein the imidazole derivative is a microencapsulated imidazole derivative.

(6) A liquid resin composition for electronic components which is used in sealing of electronic components, comprising (A) a liquid epoxy resin, (B) a curing agent containing a liquid aromatic amine, (E) silicone polymer particles, and (D) an inorganic filler.

(7) The liquid resin composition for electronic components according to the above-mentioned (6), wherein the primary particle size of the silicone polymer particles as the component (E) is 0.05 to 10 μm.

(8) A liquid resin composition for electronic components which is used in sealing of electronic components, comprising (A) a liquid epoxy resin, (B) a curing agent containing a liquid aromatic amine, (F) a nonionic surfactant, and (D) an inorganic filler.

(9) The liquid resin composition for electronic components according to the above-mentioned (8), wherein the nonionic surfactant as the component (F) is a silicone-modified epoxy resin obtained by the reaction of an epoxy resin with an organosiloxane with a weight-average molecular weight of 500 to 5000 having a functional group reacting with an epoxy group.

(10) The liquid resin composition for electronic components according to any one of the above-mentioned (1) to (9), which is used in an electronic component device having an electronic component to be bump-bonded directly onto a wiring substrate.

(11) The liquid resin composition for electronic components according to the above-mentioned (10), wherein the bump is lead-free metal.

(12) The liquid resin composition for electronic components according to the above-mentioned (10) or (11), wherein the long side of the electronic component is 5 mm or more in length, and the distance between a wiring substrate constituting the electronic component device and the bump-connected surface of the electronic component is 80 μm or less.

(13) The liquid resin composition for electronic components according to any one of the above-mentioned (10) to (12), wherein the long side of the electronic component is 5 mm or more in length, and the electronic component is a semiconductor element having a dielectric layer with a dielectric constant of 3.0 or less.

(14) An electronic component device comprising an electronic component sealed with the liquid resin composition for electronic components according to any one of the above-mentioned (1) to (13).

(15) The electronic component device according to the above-mentioned (14), wherein the bump is lead-free metal.

(16) The electronic component device according to the above-mentioned (14) or (15), wherein the long side of the electronic component is 5 mm or more in length, and the distance between a wiring substrate constituting the electronic component device and the bump-connected surface of the electronic component is 80 μm or less.

(17) The electronic component device according to any one of the above-mentioned (14) to (16), wherein the long side of the electronic component is 5 mm or more in length, and the electronic component is a semiconductor element having a dielectric layer with a dielectric constant of 3.0 or less.

The disclosure of this application is related to the subject matter of Japanese Patent Application Nos. 2005-354719, 2005-354720 and 2005-354721 filed Dec. 8, 2005, the disclosure of which is incorporated herein by reference.

BEST MODE FOR CARRYING OUT THE INVENTION

The liquid epoxy resin as the component (A) used in the present invention is not particularly limited as long as the epoxy resin is liquid at ordinary temperature and has one or more epoxy groups in one molecule, and the liquid epoxy resin used generally in liquid resin compositions for electronic components can be used. Examples of the epoxy resin usable in the present invention include diglycidyl ether type epoxy resins obtained from bisphenol A resin, bisphenol F resin, bisphenol AD resin, bisphenol S resin, hydrogenated bisphenol A resin etc.; epoxy resins typified by ortho-cresol novolac type epoxy resins, wherein novolac resins consisting of phenols and aldehydes were epoxylated; glycidyl ester type epoxy resins obtained by reacting polybasic acids such as phthalic acid and dimer acid with epichlorohydrin; glycidyl amine type epoxy resins obtained by reacting amine compounds such as p-aminophenol, diaminodiphenyl methane and isocyanuric acid with epichlorohydrin; and linear aliphatic epoxy resins and alicyclic epoxy resins obtained by oxidizing olefin bonds with peracids such as peracetic acid. These may be used alone or as a mixture of two or more thereof. From the viewpoint of fluidity, the liquid bisphenol type epoxy resin is preferable, and from the viewpoint of heat resistance, adhesiveness and fluidity, the liquid glycidyl amine type epoxy resin is preferable.

The two epoxy resins mentioned above may be used alone or as a mixture of two or more epoxy resins, and their compounding amount is preferably 20% by mass or more, more preferably 30% by mass or more, still more preferably 50% by mass or more, based on the total amount of the liquid epoxy resin, in order to exhibit the intended performance.

A solid epoxy resin can be used in combination with the liquid resin composition for electronic components according to the present invention in such a range that the effect of the present invention can be achieved. From the viewpoint of fluidity during forming, the amount of the solid epoxy resin used in combination is preferably 20% by mass or less based on the total amount of the epoxy resin. With respect to the purity of these epoxy resins, the amount of particularly hydrolysable chlorine herein is preferably lower because the chlorine is involved in corrosion of aluminum wiring on an element such as IC, and the amount of such chlorine is preferably 500 ppm or less in order to obtain the liquid resin composition for electronic components excellent in moisture resistance. As used herein, the amount of hydrolysable chlorine is determined by dissolving 1 g of the epoxy resin as a sample in 30 ml dioxane, adding 5 ml of 1 N KOH in methanol, refluxing it for 30 minutes, and then measuring the amount of chlorine therein by potentiometrical titration.

The liquid aromatic amine-containing curing agent (B) used in the present invention is not particularly limited insofar as it is an amine that is liquid at ordinary temperature and has an aromatic ring. Examples thereof include diethyl toluene diamine, 1-methyl-3,5-diethyl-2,4-diaminobenzene, 1-methyl-3,5-diethyl-2,6-diaminobenzene, 1,3,5-triethyl-2,6-diaminobenzene, 3,3'-diethyl-4,4'-diaminodiphenylmethane, and 3,5,3',5'-tetramethyl-4,4'-diaminodiphenylmethane. These liquid aromatic amine compounds are available as commercial products for example under trade names jER Cure-W and jER Cure-Z (manufactured by Japan Epoxy Resins Co., Ltd.), Kaya Hard A-A, Kaya Hard A-B and Kaya Hard A-S (manufactured by Nippon Kayaku Co., Ltd.), Tohto Amine HM-205 (manufacturedbyTohtoKasei Co., Ltd.), AdekaHardnerEH-101 (manufactured by Asahi Denka Co., Ltd.), Epomic Q-640 and Epomic Q-643 (manufactured by Mitsui Chemicals, Inc.) and DETDA 80 (manufactured by Lonza), and these can be used alone or as a mixture of two or more thereof.

From the viewpoint of storage stability, the liquid aromatic amine contained in the curing agent (B) is preferably 3,3'- diethyl-4,4'-diaminodiphenylmethane or diethyl toluene diamine, and preferably any one of such compounds or a mixture thereof is main component of the curing agent. The diethyl toluene diamine includes 3,5-diethyltoluene-2,4-diamine and 3,5-diethyltoluene-2,6-diamine, and these may be used alone or as a mixture thereof. Preferably, the curing agent contains at least 60 mass % of 3,5-diethyltoluene-2,4-diamine.

In the curing agent (B) in the liquid resin composition for electronic components according to the present invention, another curing agent such as a phenolic curing agent and an acid anhydride used generally in liquid resin compositions for electronic components can be used in combination with the liquid aromatic amine in such a range that the effect of the present invention can be achieved. A solid curing agent such as a solid amine, an imidazole compound etc. can also be simultaneously used. From the viewpoint of heat resistance, a solid amine is preferable, and from the viewpoint of fluidity, an allylated phenol novolac resin is preferable.

When another curing agent is used, the amount of the liquid aromatic amine-containing curing agent (B) is preferably 60 mass % or more, based on the total amount of the curing agent (B), in order to exhibit its performance. The equivalent ratio of the epoxy resin containing the component (A) and the solid epoxy resin to the total amount of the curing agent (B) is not particularly limited, but for reducing their unreacted matter, the amount of the curing agent is established preferably in the range of 0.7 to 1.6 equivalents, more preferably 0.8 to 1.4 equivalents, still more preferably 0.9 to 1.2 equivalents, relative to the epoxy resin.

The hardening accelerator (C) used in the present invention is not particularly limited as long as it can accelerate the reaction between the epoxy resin containing the liquid epoxy resin as the component (A) and the liquid aromatic amine-containing curing agent (B), and conventionally known ones can be used.

Examples of such hardening accelerators include cycloamidine compounds and derivatives thereof, such as 1,8-diaza-bicyclo (5,4,0) undecene-7,1,5-diaza-bicyclo (4,3,0) nonene and 5,6-dibutylamino-1,8-diaza-bicyclo (5,4,0) undecene-7;

tertiary amine compounds and derivatives thereof, such as triethylene diamine, benzyldimethylamine, triethanolamine, dimethylaminoethanol, and tris(dimethylaminomethyl)phenol; imidazole compounds and derivatives thereof, such as 2-methyl imidazole, 2-ethyl-4-methyl imidazole, 2-phenyl imidazole, 2-phenyl-4-methyl imidazole, 1-benzyl-2-phenyl imidazole, 1-benzyl-2-methyl imidazole, 2-phenyl-4,5-dihydroxymethyl imidazole, 2-phenyl-4-methyl-5-hydroxymethyl imidazole, 2,4-diamino-6-(2'-methylimidazolyl-(1'))-ethyl-s-triazine, and 2-heptadecyl imidazole;

organic phosphines and derivatives thereof, for example trialkyl phosphine such as tributyl phosphine, dialkyl aryl phosphine such as dimethyl phenyl phosphine, alkyl diaryl phosphine such as methyl diphenyl phosphine, triphenyl phosphine, and alkyl-substituted triphenyl phosphine;

compounds having π bonds and derivatives thereof, obtained by adding compounds having intramolecular polarization such as maleic anhydride, quinone compounds such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone and phenyl-1,4-benzoquinone, or diazophenyl methane and phenol resin, to the above organic phosphine compounds; and phenyl boron salts such as 2-ethyl-4-methylimidazole tetraphenylborate and N-methylmorpholine tetraphenylborate. These hardening accelerators may be used alone or as a mixture of two or more thereof.

Examples of a latent hardening accelerator include core-shell particles wherein an amino group-containing compound in solid state at ordinary temperature, particularly an imidazole derivative, is coated as a core with an epoxy compound as a shell in solid state at ordinary temperature, and such latent hardening accelerators are commercially available as Amicure (trade name, manufactured by Ajinomoto Co., Inc.), and Novacure (trade name, manufactured by Asahi Kasei Chemicals Corporation) wherein a microencapsulated imidazole derivative is dispersed in a bisphenol A epoxy resin and bisphenol F epoxy resin.

The latent hardening accelerator exhibits its hardening accelerating function under a certain condition such as a specific temperature, and examples include latent hardening accelerators wherein usual hardening accelerators are protected with microcapsules etc. or have a structure of salts having various compounds added thereto. In this case, the latent hardening accelerator, when placed at a specific temperature or more, releases its hardening accelerator from the microcapsule or the adduct.

From the viewpoint of balance between the hardening accelerating action and reliability, the hardening accelerator is preferably an imidazole derivative. From the viewpoint of satisfying both hardening properties and formability, the hardening accelerator is preferably 2-phenyl-4,5-dihydroxymethylimidazole, 2-phenyl-4-methyl-5-hydroxymethylimidazole, 2,4-diamino-6-(2'-methylimidazolyl-(1'))-ethyl-s-triazine, or 2-heptadecyl imidazole, and from the viewpoint of storage stability, the hardening accelerator is more preferably the above-mentioned Novacure (trade name) manufactured by Asahi Kasei Chemicals Corporation, that is, a latent hardening accelerator wherein a microencapsulated imidazole derivative is dispersed in a bisphenol A epoxy resin and bisphenol F epoxy resin, still more preferably a phenyl group- and hydroxyl group-substituted imidazole derivative, that is, 2-phenyl-4,5-dihydroxymethylimidazole or 2-phenyl-4-methyl-5-hydroxymethylimidazole.

The amount of the hardening accelerator compounded is not particularly limited insofar as the hardening accelerating effect can be achieved. The amount of the hardening accelerator is preferably 0.2 to 5% by mass, more preferably 0.5 to 3% by mass, based on the epoxy resin containing the liquid epoxy resin (A) and the solid epoxy resin. When the amount is lower than 0.2% by mass, the resulting composition tends to be inferior in hardening properties at low temperature, while when the amount is higher than 5% by mass, the hardening speed is too high to be regulated, and the resulting composition tends to be inferior in storage stability such as in pot life and shell life. When the amount is lower than 0.2% by mass, the effect of the hardening accelerator cannot be sufficiently exhibited, and as a result, generation of voids during forming cannot be suppressed, while its effect on reduction of warpage tends to be insufficient.

If the hardening accelerator is incorporated not as a hardening-accelerating component only, but as a composition which like as the latent hardening accelerator, contains a hardening-accelerating component and an epoxy compound, an epoxy resin component or the like, then all ingredients including the dispersed epoxy resin etc. are considered as a hardening accelerator, and the amount of such a hardening accelerator based on the other epoxy resin is preferably 0.1 to 40% by mass, more preferably 0.5 to 20% by mass, still more preferably 0.8 to 10% by mass. When the amount is lower than 0.1 mass %, the resulting composition tends to be inferior in hardening properties at low temperature, while when the amount is higher than 40 mass %, the hardening speed is too high to be regulated, and the resulting composition tends to be inferior in storage stability such as in pot life and shell life.

The inorganic filler as the component (D) used together with the components (A) and (B) includes, for example, silica such as molten silica and crystalline silica, calcium carbonate, clay, alumina such as alumina oxide, powders of silicon nitride, silicon carbide, boron nitride, calcium silicate, potassium titanate, aluminum nitride beryllia, zirconia, zircon, forsterite, steatite, spinel, mullite, and titania, which may be provided in the form of ensphered beads, glass fiber and the like.

A flame-retardant inorganic filler includes aluminum hydroxide, magnesium hydroxide, zinc borate, zinc molybdate etc. These inorganic fillers may be used alone or as a mixture of two or more thereof. Among these compounds, molten silica is preferable, and from the viewpoint of the fluidity of the liquid resin composition for electronic components and the permeability thereof into a microscopic gap, spherical silica is more preferable.

The average particle size of the inorganic filler, particularly in the case of spherical silica, is preferably in the range of 0.3 to 10 µm, more preferably in the range of 0.5 to 5 µm. When the average particle diameter is less than 0.5 µm, the inorganic filler tends to be poor in dispersibility in a liquid resin, and the resulting liquid resin composition for electronic components is endowed with thixotropic properties and thus tends to be inferior in flow characteristics, while when the average particle diameter is greater than 10 µm, the filler tends to be easily precipitated, and the permeability, into minute gaps, of the resultant liquid resin composition for electronic components and the fluidity thereof tend to be decreased to easily cause voids or failure in filling.

The amount of the inorganic filler compounded is established preferably in the range of 20 to 90% by mass, more preferably 25 to 80% by mass, still more preferably 30 to 60% by mass, based on the whole of the liquid resin composition for electronic components. When the amount of the inorganic filler compounded is lower than 20% by mass, its effect on reduction of coefficient of thermal expansion tends to be lowered, while when the amount is higher than 90% by mass, the viscosity of the liquid resin composition for electronic components tends to be increased to cause a reduction in fluidity and permeability and in the ability thereof to be dispensed.

The silicone polymer particles as the component (E) in the present invention are used for mainly improving flexibility. The silicone polymer particles are not particularly limited, and examples thereof include silicone rubber particles obtained by crosslinking polyorganosiloxanes such as linear polydimethylsiloxane, polymethylphenylsiloxane and polydiphenylsiloxane, and particles obtained by coating the above silicone rubber particles with a silicone resin. These silicone polymer particles can be used regardless of whether their shape is amorphous or spherical, but spherical ones are preferably used in order that viscosity related to the formability of the liquid resin composition for electronic components can be suppressed at low level. As these silicone polymer particles, commercial products are available from Dow Corning Toray Silicone Co., Ltd. and Shin-Etsu Chemical Co., Ltd.

As the silicone polymer particles as the component (E), core-shell polymer particles each consisting of a core of a solid silicone polymer and a shell of an organic polymer such as an acrylic resin or an acrylic resin copolymer can be used. The method of obtaining these core-shell polymer particles includes a method that involves synthesizing a silicone polymer serving as a core by emulsion polymerization and then adding an acrylic monomer and an initiator to effect second-stage polymerization thereby forming a shell on the core. In this case, a siloxane compound having a double bond is suitably blended with the siloxane monomer or an oligomer component used in the first-stage polymerization, thereby grafting the acrylic resin via the double bond to strengthen the interface between the core and the shell, and thus the silicone polymer particles obtained in this manner can be used to increase the strength of a cured product of the liquid resin composition for electronic components.

The primary particle size of the silicone polymer particles as the component (E) is preferably smaller to uniformly modify the composition, and the primary particle size is preferably in the range of 0.05 to 10 µm, more preferably in the range of 0.1 to 5 µm. When the primary particle size is less than 0.05 µm, the silicone polymer particles tend to be inferior in dispersibility in the liquid epoxy resin composition, while when the average particle size is greater than 10 µm, their improvement effect of reducing stress tends to be decreased, and the permeability, into minute gaps, of the liquid resin composition for electronic components and the fluidity thereof tend to be decreased to easily cause voids or failure in filling. The primary particle size shall be a value obtained by directly observing the silicone polymer particles under an electron microscope or the like.

The amount of the silicone polymer particles compounded as the component (E) is established preferably in the range of 1 to 30% by mass, more preferably 2 to 20% by mass, based on the whole (excluding the filler) of the liquid resin composition for electronic components. When the amount of the silicone polymer particles compounded is lower than 1% by mass, their effect of reducing stress tends to be decreased, while when the amount is higher than 30% by mass, the viscosity of the liquid resin composition for electronic components tends to be increased to make the composition inferior in formability (flow characteristic).

From the viewpoint of improvement in thermal shock resistance and of reduction in stress on semiconductor elements, the liquid resin composition for electronic components according to the present invention can be compounded with various flexible agents other than the silicone polymer particles as the component (E). The flexible agents are not particularly limited, but are preferably rubber particles, and such rubber particles can be exemplified by rubber particles of styrene-butadiene rubber (SBR), nitrile-butadiene rubber (NBR), butadiene rubber (BR), urethane rubber (UR) and acrylic rubber (AR) Particularly from the viewpoint of heat resistance and moisture resistance, the rubber particles are preferably rubber particles consisting of an acrylic rubber, more preferably core/shell acrylic rubber particles consisting of a core/shell acrylic polymer. From the viewpoint of handleability and dispersibility in the resin component, fine rubber particles previously finely dispersed in the epoxy resin or in the curing agent can also be used, and such fine rubber particles include, for example, a rubber-modified epoxy resin that is liquid at ordinary temperature.

From the viewpoint of reducing voids during forming and of improving adhesion by improving wetting properties on various adherends, the liquid resin composition for electronic components according to the present invention can be compounded with various surfactants. The nonionic surfactant (F) includes, but is not limited to, polyoxyethylene alkyl ether-based surfactants, polyoxyalkylene alkyl ether-based surfactants, sorbitan fatty acid ester-based surfactants, polyoxyethylene sorbitan fatty acid ester-base surfactants, polyoxyethylene sorbitol fatty acid ester-based surfactants, glycerin fatty acid ester-based surfactants, polyoxyethylene fatty acid ester-based surfactants, polyoxyethylene alkyl amine-based surfactants, alkyl alkanol amide-based surfactants, polyether-modified silicone-based surfactants, aralkyl-modified silicone-based surfactants, polyester-modified silicone-based surfactants, and polyacrylic surfactants, and these surfactants may be used alone or as a mixture of two or more thereof. Among these surfactants, the polyether-modified silicone-based surfactants and aralkyl-modified silicone-based surfactants are effective in reducing the surface tension of the liquid resin composition for electronic components. These surfactants are available as commercial products from BYK-Chemie Japan (trade names: BYK-307, BYK-333, BYK-377, BYK-323), Kao Corporation, etc. A surfactant other than the nonionic surfactant may also be simultaneously used.

Further, a silicone-modified epoxy resin can also be added as the nonionic surfactant (F). The silicone-modified epoxy resin can be obtained as a reaction product between an organosiloxane having a functional group reacting with an epoxy group and an epoxy resin and is preferably one that is liquid at ordinary temperature. The silicone-modified epoxy resin can be localized on the surface of a liquid, to reduce the surface tension of the liquid. The liquid can thereby have increased wetting properties to make the fluid easily fluidized and is thus endowed with an effect of improving permeability into narrow gaps and of reducing entrained voids.

Examples of the organosiloxane having a functional group reacting with an epoxy group include dimethylsiloxane, diphenylsiloxane and methylphenylsiloxane having, in one molecule, one or more amino groups, carboxyl groups, hydroxyl groups, phenolic hydroxyl groups, mercapto groups and the like. These organosiloxanes can be available as commercial products under trade names BY16-799, BY16-871 and BY16-004 (manufactured by Dow Corning Toray Silicone Co., Ltd.) and under trade names X-22-1821 and KF-8010 (manufactured by Shin-Etsu Chemical Co., Ltd.). The molecular structure of the organosiloxane may be either linear or branched. The silicone-modified epoxy resin is preferably one obtained by reacting 50 to 150 parts by mass of a silicone component having a functional group capable of reacting with an epoxy group, with 100 parts by mass of a raw epoxy resin.

The weight-average molecular weight of the organosiloxane is preferably in the range of 500 to 5000, more preferably in the range of 100 to 3000. This is because when the molecular weight is lower than 500, the compatibility of the organosiloxane with a resin is so high that the effect thereof as an additive cannot be exhibited, while when the molecular weight is higher than 5000, the compatibility of the organosiloxane with a resin is so low that the silicone-modified epoxy resin is separated and exuded upon forming, to deteriorate adhesiveness and appearance. In the present invention, the weight-average molecular weight is determined with a standard curve using standard polystyrene in gel permeation chromatography (GPC). Specifically, the weight-average molecular weight is determined by reference to measurement results in GPC using a pump (L-6200 manufactured by Hitachi, Ltd.), columns (trade names: TSKgel-G5000HXL and TSKgel-G2000HXL, manufactured by Tosoh Corporation) and a detector (L-3300RI manufactured by Hitachi, Ltd.) with tetrahydrofuran as an eluent under the conditions of a temperature of 30° C. and a flow rate of 1.0 ml/min.

The epoxy resin for obtaining the silicone-modified epoxy resin is not particularly limited as long as it is compatible with the resin in the liquid resin composition for electronic components, and the epoxy resin used generally in liquid resin compositions for electronic components can be used. Examples thereof include glycidyl ether type epoxy resins obtained by reacting epichlorohydrin with bisphenol A, bisphenol F, bisphenol AD, bisphenol S, naphthalene diol, hydrogenated bisphenol A; novolac type epoxy resins such as an ortho-cresol novolac type epoxy resin, wherein novolac resins obtain by condensing or co-condensing phenols with aldehydes were epoxylated; glycidyl ester type epoxy resins obtained by reacting polybasic acids such as phthalic acid and dimer acid with epichlorohydrin; glycidyl amine type epoxy resins obtained by reacting polyamines such as diaminodiphenyl methane and isocyanuric acid with epichlorohydrin; and linear aliphatic epoxy resins and alicyclic epoxy resins obtained by oxidizing olefin bonds with peracids such as peracetic acid. These may be used alone or as a mixture of two or more thereof, which is preferably in liquid state at ordinary temperature. Particularly preferable among those described above are bisphenol A epoxy resin, bisphenol F epoxy resin and bisphenol AD epoxy resin.

The amount of the surfactant (F) added is preferably 0.01 to 1.5% by mass, more preferably 0.05 to 1% by mass, based on the whole of the liquid resin composition for electronic components. When the amount of the surfactant (F) is lower than 0.01% by mass, the effect thereof as an additive cannot be sufficiently attained, while when the amount is higher than 1.5% by mass, the surfactant tends to be exuded upon forming to deteriorate adhesiveness.

In the liquid resin composition for electronic components according to the present invention, coupling agents can be used if necessary for the purpose of strengthening the interfacial adhesion between the resin and the inorganic filler or between the resin and a constructional element of an electronic component. These coupling agents are not particularly limited, and conventionally known ones can be used. Examples thereof include, for example, silane compounds having primary and/or secondary and/or tertiary amino groups, various silane compounds such as epoxysilane, mercapto silane, alkyl silane, ureido silane and vinyl silane, titanium compounds, aluminum chelates, and aluminum/zirconium compounds.

Examples of such compounds include silane-based coupling agents such as vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltrimethoxysilane, γ-aminopropylmethyldimethoxysilane, γ-aminopropyltriethoxysilane, γ-aminopropylmethyldiethoxysilane, γ-anilinopropyltrimethoxysilane, γ-anilinopropyltriethoxysilane, γ-(N,N-dimethyl)aminopropyltrimethoxysilane, γ-(N,N-diethyl)aminopropyltrimethoxysilane, γ-(N,N-dibutyl)aminopropyltrimethoxysilane, γ-(N-methyl)anilinopropyltrimethoxysilane, γ-(N-ethyl)anilinopropyltrimethoxysilane, γ-(N,N-dimethyl)aminopropyltriethoxysilane, γ-(N,N-diethyl)aminopropyltriethoxysilane, γ-(N,N-dibutyl)aminopropyltriethoxysilane, γ-(N-methyl)anilinopropyltriethoxysilane, γ-(N-ethyl)anilinopropyltriethoxysilane, γ-(N,N-dimethyl)aminopropylmethyldimethoxysilane, γ-(N,N-diethyl)aminopropylmethyldimethoxysilane, γ-(N,N-dibutyl)aminopropylmethyldimethoxysilane, γ-(N-methyl)anilinopropylmethyldimethoxysilane, γ-(N-ethyl)anilinopropylmethyldimethoxysilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, γ-chloropropyltrimethoxysilane, hexamethyldisilane, vinyltrimethoxysilane and γ-mercaptopropylmethyldimethoxysilane, and titanate-based coupling agents such as isopropyltriisostearoyl titanate, isopropyltris (dioctylpyrophosphate) titanate, isopropyltri(N-aminoethyl-aminoethyl)titanate, tetraoctylbis (ditridecylphosphite)titanate, tetra(2,2-diallyloxymethyl-1-butyl)bis (ditridecyl)phosphite titanate, bis(dioctylpyrophosphate) oxyacetate titanate, bis(dioctylpyrophosphate)ethylene titanate, isopropyltrioctanoyl titanate, isopropyldimethacrylisostearoyl titanate, isopropyltridodecylbenzenesulfonyl titanate, isopropylisostearoyldiacryl titanate, isopropyltri (dioctylphosphate)titanate, isopropyltricumylphenyl titanate, and tetraisopropylbis(dioctylphosphite)titanate. They can be used singly or in combination thereof.

The amount of the coupling agent incorporated is preferably 0.1 to 3.0% by mass, more preferably 0.2 to 2.5% by mass, based on the liquid resin composition. When the amount is lower than 0.1% by mass, the adhesiveness between a substrate and a cured product of the liquid resin composition tends to be decreased, while when the amount is higher than 3.0% by mass, voids tend to be easily generated.

From the viewpoint of improving the migration resistance, moisture resistance and high-temperature resistance of semiconductor elements such as IC, an ion-trapping agent can be contained if necessary in the liquid resin composition for electronic components according to the present invention. The ion-trapping agent is not particularly limited, and conventionally known ion-trapping agents can be used. Particularly, the ion-trapping agent is preferably a hydrotalcite represented by the following compositional formula (I) or a hydrate oxide of bismuth represented by the following formula (II).

$$Mg_{1-x}Al_x(OH)_2(CO_3)_{x/2} \cdot mH_2O \qquad (I)$$

wherein $0 < X \leq 0.5$, and m is a positive number.

$$BiO_x(OH)_y(NO_3)_z \qquad (II)$$

wherein $0.9 \leq x \leq 1.1$, $0.6 \leq y \leq 0.8$, and $0.2 \leq z \leq 0.4$.

The amount of the ion-trapping agent added is not particularly limited insofar as the ion-trapping agent is in an amount enough to trap anions such as halogen ions. From the viewpoint of migration resistance, the amount of the ion-trapping agent is preferably 0.1 to 3.0 mass %, more preferably 0.3 to 1.5 mass %, based on the liquid resin composition. The average particle size of the ion-trapping agent is preferably 0.1 to 3.0 μm, and the maximum particle size is preferably 10 μm or less. A compound of the formula (I) above is commercially available as DHT-4A (trade name) manufactured by Kyowa Chemical Industry Co., Ltd. A compound of the formula (II) above is commercially available as IXE500 (trade name) manufactured by Toagosei Co., Ltd. If necessary, another anion-trapping agent may be added. Examples include hydrate oxides of an element selected from magnesium, aluminum, titanium, zirconium, and antimony, and they can be used singly or in combination of two or more thereof.

The liquid resin composition for electronic components according to the present invention can be compounded if necessary with other additives, for example a dye, a colorant such as carbon black, titanium oxide or read lead, a flame retardant, a diluent, a leveling agent, another flexible agent, a defoaming agent etc.

As the flame retardant, a brominated epoxy resin and antimony trioxide can be used, but a halogen- and antimony-free flame retardant is preferably used. For example, red phosphorus, red phosphorus coated with a thermoplastic resin such a phenol resin, phosphorus compounds such as a phosphate and triphenyl phosphine oxide, nitrogen-containing compounds such as melamine, a melamine derivative, a melamine-modified phenol resin, a compound having a triazine ring, a cyanuric acid derivative and an isocyanuric acid derivative, phosphorus- and nitrogen-containing compounds such as cyclophosphazene, metal complex compounds such as dicyclopentadienyl iron, zinc compounds such as zinc oxide, zinc stannate, zinc borate and zinc molybdate, metal oxides such as iron oxide and molybdenum oxide, metal hydroxides such as aluminum hydroxide and magnesium hydroxide, and composite metal hydroxides represented by the following compositional formula (III):

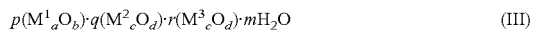

$$p(M^1{}_aO_b) \cdot q(M^2{}_cO_d) \cdot r(M^3{}_cO_d) \cdot mH_2O \qquad (III)$$

wherein $M^1$, $M^2$ and $M^3$ represent metal elements different from one another, a, b, c, d, p, q and m each represent a positive number, and r represents 0 or a positive number.

$M^1$, $M^2$ and $M^3$ in the compositional formula (III) are not particularly limited insofar as they are metal elements different from one another. From the viewpoint of flame resistance, $M^1$ is preferably selected from the group consisting of metal elements belonging to the third period, alkaline earth metal elements of group IIA and metal elements belonging to groups IVB, IIB, VIII, IB, IIIA and IVA, and $M^2$ is preferably selected from transition metal elements of groups IIIB to IIB. The metal $M^1$ is more preferably selected from the group consisting of magnesium, calcium, aluminum, tin, titanium, iron, cobalt, nickel, copper and zinc, and $M^2$ is more preferably selected from the group consisting of iron, cobalt, nickel, copper and zinc. From the viewpoint of fluidity, $M^1$ is preferably magnesium, $M^2$ is preferably zinc or nickel, and preferably $r=0$. The molar ratio of p, q and r is not particularly limited, but preferably $r=0$ and $p/q$ is 1/99 to 1/1. The classification of the metal elements is based on the long form of the periodic table in which typical elements are to be in A subgroup and transition elements are to be in B subgroup. The flame retardants described above may be used singly or as a mixture of two or more thereof.

As the diluent, a reactive diluent having an epoxy group may be mixed for regulation of viscosity. The reactive diluent having an epoxy group includes, for example, n-butyl glycidyl ether, versatic acid glycidyl ether, styrene oxide, ethyl hexyl glycidyl ether, phenyl glycidyl ether, butyl phenyl glycidyl ether, 1,6-hexane diol diglycidyl ether, neopentyl glycol diglycidyl ether, diethylene glycol diglycidyl ether, and trimethylol propane triglycidyl ether. These diluents may be used alone or as a mixture of two or more thereof.

The liquid resin composition for electronic components according to the present invention may be produced by any methods wherein the respective components described above can be uniformly dispersed and mixed with one another. Generally, the liquid resin composition can be obtained by weighing out the materials of predetermined amounts, mixing and kneading them by a mortar and pestle machine, a mixing roll, a planetary mixer or the like, and defoaming the mixture if necessary.

Electronic component devices obtained by sealing electronic components with the liquid resin composition for electronic components obtained in the present invention include electronic component devices which load elements such as active elements (for example, semiconductor chip, transistor, diode, and thyristor) and passive elements (for example, capacitor, resistance, resistant array, coil and switch) onto a supporting member (for example, lead frame, wired tape carrier, rigid and flexible circuit board, glass, and silicon wafer) whose necessary part(s) is sealed with the liquid resin composition for electronic components according to the present invention. Particularly, the liquid resin composition for electronic components according to the present invention is preferably used in sealing an electronic component device having an electronic component bump-bonded directly onto a wiring substrate. For example, the liquid resin composition is applied to a semiconductor device wherein a semiconductor element is subjected via bump connection to flip-chip bonding to a wiring formed on a rigid or flexible circuit board or on a glass. Specific examples include semiconductor devices such as flip chip BGA/LGA and COF (Chip on Film). Particularly, the liquid resin composition for electronic components obtained according to the present invention is preferable as an underfill material for flip chips excellent in reliability. The liquid resin composition of the present invention can also be effectively used for printed circuit boards.

In the field of flip chips for which the liquid resin composition for electronic components according to the present invention is particularly suitable, there is a flip chip semiconductor device wherein bumps for connecting a wiring substrate to a semiconductor element are made of not conventional lead-containing solder but lead-free solder such as Sn—Ag—Cu solder. The liquid resin composition for electronic components according to the present invention can maintain excellent reliabilityeven for a flip chip using connection via bumps of lead-free solder which is physically more brittle than conventional lead solder.

Further, the liquid resin composition for electronic components according to the present invention is suitable for a large-size semiconductor element whose long side is 5 mm or more, and can provide a semiconductor device excellent in fluidity and reliability such as in filling, moisture resistance, thermal shock resistance etc. in flip-chip bonding where the distance between a wiring substrate constituting the electronic component device and the bump-connected surface of the electronic component is 80 μm or less. With the speed-up of semiconductor elements in recent years, interlayer dielectric films of low dielectric constant are formed on semiconductor elements, but such low-dielectric insulating materials are poor in mechanical strength and liable to breakdown by external stress. This tendency becomes significant as the size of the element is increased, and there is demand for reduction in stress from the underfill material. The liquid resin composition of the present invention can provide excellent reliability for a flip chip semiconductor device on which a semiconductor element having a long side of 5 mm or more and a dielectric layer with a dielectric constant of 3.0 or less has been mounted.

The method of sealing an electronic component with the liquid resin composition for electronic components according to the present invention includes a discharging method, a casting method, a printing method etc.

Examples

Hereinafter, the present invention is described in more detail by reference to the Examples, but the present invention is not limited to these examples.

Test methods for examining characteristics in the Examples and Comparative Examples are collectively shown below. Evaluation of characteristics of the used liquid resin compositions for electronic components, examination of impregnation time, void observation and reliability evaluation were carried out using the following methods and conditions. Semiconductor devices used in evaluation of impregnation time, void observation, evaluation of chip warpage, and reliability evaluation in (8) to (13) were the following 2 types of flip chip BGA.

(Non Low-K Flip Chip BGA)

The specifications of this flip chip BGA are as follows: chip size, 20×20×0.55 tmm (circuit, aluminum with daisy chain connection; passivation, polyimide film (trade name: HD4000) manufactured by HD MicroSystems, Ltd.); bumps, solider balls (Sn—Ag—Cu, φ80 μm, 7,744 pins); bump pitch, 190 μm; substrate, FR-5 (60×60×0.8 tmm, solder resist SR7000 (trade name), manufactured by Hitachi Chemical Co., Ltd.); and chip/substrate gap, 50 μm).

(Low-K Flip Chip BGA)

The specifications of this flip chip BGA are as follows: chip size, 20×20×0.55 tmm (3-layered dielectric layer with a dielectric constant of 2.7; circuit, aluminum with daisy chain connection; passivation, polyimide film (trade name: HD4000) manufactured by HD MicroSystems, Ltd.); bumps, solider balls (Sn—Ag—Cu, φ80 μm, 7,744 pins); bump pitch, 190 μm; substrate, FR-5 (60×60×0.8 tmm, solder resist SR7000 (trade name), manufacturedbyHitachi Chemical Co., Ltd.); and chip/substrate gap, 50 μm).

Semiconductor devices were prepared by underfilling each of the BGAs with the liquid resin composition for electronic components by a discharging system and then curing the composition for 2 hours at curing temperatures shown in Tables 4 and 5 for Examples 1 to 11 and Comparative Examples 1 to 4, respectively. Curing of each test specimen was carried out under similar conditions. The semiconductor devices in Examples 12 to 18 and Comparative Examples 5 to 8 were prepared by curing under heating conditions of 165° C. and 2 hours. Curing conditions for each test specimen were 150° C. and 3 hours. The semiconductor devices in Examples 19 to 31 and Comparative Examples 9 to 14 were prepared by curing under heating conditions of 165° C. and 2 hours. Curing conditions for each test specimen were 165° C. and 2 hours.

(1) Viscosity, Thixotropic Index

The viscosity at 25° C. of the liquid resin composition for electronic components was measured with an E-type viscometer (cone angle 3°, revolution speed 5 rpm). As the thixotropic index, the ratio of the viscosity measured at a revolution speed of 10 rpm to the viscosity measured at a revolution speed of 2.5 rpm was measured.

(2) Gelling Time at 165° C.

The time having elapsed from when the prepared liquid resin composition for electronic components was dropped on a hot plate at 165° C. till when the liquid resin composition was initiated to be gelled was determined with a gelling testing machine.

(3) Weight Loss by Heating

Using a thermogravimetric measurement apparatus TGA-Q500 (manufactured by TA Instruments, Inc.), 20 mg of the liquid resin composition for electronic components was heated at an increasing temperature of 10° C./min. from room temperature to 165° C., then kept at 165° C. for 2 hours and measured for its weight loss (% by mass).

(4) Tg

Using a thermo-mechanical analyzer TMA 4000SA (manufactured by Mac Science), a test specimen (3 mm×3 mm×20 mm) cured under predetermined conditions was measured under the conditions of a loading of 15 g, a measurement temperature of from 0° C. to 200° C. and an increasing temperature of 10° C./min.

(5) Elastic Modulus

Using a dynamic viscoelasticity measuring instrument DMA-Q 800 (trade name) manufactured by TA Instruments, Inc., a test specimen (4 mm width×40 mm length×1 mm thickness) cured under predetermined conditions was measured for its storage elastic modulus at 25° C. under the conditions of a span of 22 mm, a measurement temperature of −60° C. to 300° C., an increasing temperature of 5° C./min and a frequency of 1 Hz.

(6) Surface Tension

Using a surface tension measuring instrument DCAT11 (manufactured by Eko Instruments Co., Ltd.), the surface tension at 25° C. of the liquid resin composition for electronic components was measured by a plate method (19.9 mm×10 mm×0.2 mm, a platinum-iridium Wilhelmy plate).

(7) Adhesion

SR Adhesion

A test specimen having the liquid resin composition for electronic components of 3 mm in diameter and 3 mm in height formed on the surface of a solder resist SR7000 (trade name) manufactured by Hitachi Chemical Co., Ltd. was prepared followed by applying shear stress to the specimen under the condition of a head speed of 50 μm/sec. at 25° C. with a bond tester DS100 (manufactured by DAGE), to determine the strength required for releasing the test specimen from the solder resist. This measurement was respectively carried out immediately after the test specimen was prepared and after treated for 150 hours under the HAST (highly accelerated temperature and humidity stress test) conditions of 130° C. and 85% RH.

PI Adhesion

A test specimen having the liquid resin composition for electronic components of 3 mm in diameter and 3 mm in height formed on the surface of a photosensitive polyimide HD4000 (trade name) manufactured by HD MicroSystems, Ltd. was prepared followed by applying shear stress to the specimen under the condition of a head speed of 50 μm/sec. at 25° C. with a bond tester DS100 (manufactured by DAGE), to determine the strength required for releasing the test specimen from the photosensitive polyimide. This measurement was respectively carried out immediately after the test specimen was prepared and after treated for 150 hours under the HAST conditions of 130° C. and 85% RH.

(8) Impregnation Time

A semiconductor device was placed on a hot plate heated at 110° C., and a predetermined amount of the liquid resin composition for electronic components was dropped on one side of the chip by a dispenser, and the time for the resin composition to permeate and reach the opposite side was measured.

(9) Void Observation

A semiconductor device was prepared by underfilling with the liquid resin composition for electronic components and then curing the composition, and the inside of the semiconductor device was observed with an ultrasonic flaw detector AT-5500 (manufactured by Hitachi Construction Machinery Co., Ltd.) to examine whether voids had been generated or not.

(10) Chip Warpage

A semiconductor device prepared by underfilling with the liquid resin composition for electronic components and then curing the composition was measured for its diagonal chip warpage (μm) at room temperature with a surface roughness measuring instrument Surfcoder SE-2300 (manufactured by Kosaka Laboratory Ltd.).

(11) Reflow Resistance

A semiconductor device prepared by underfilling with the liquid resin composition for electronic components and then curing the composition was dried by heating at 120° C. for 12 hours, then allowed to absorb moisture under 60% RH at 85° C. for 168 hours and passed 3 times through a reflow furnace in a far-infrared heating system (preheating, 150° C. to 180° C. for 50 seconds; peak temperature, 260° C.; heating time at 250° C. or more, 40 seconds), and the inside of the semiconductor device was observed with an ultrasonic flaw detector, whereby the release of the cured resin from the chip and the substrate, and cracking of the cured resin, were examined thereby evaluating reflow resistance in terms of the number of defective packages/number of evaluated packages.

(12) Heat Cycle Resistance

A semiconductor device prepared by underfilling with the liquid resin composition for electronic components and then curing the composition was subjected to 1000 heat cycles each consisting of treatment at −50° C. to 150° C. for 30 minutes and then examined in a conduction test to examine breaking defects in an aluminum wiring and a pad, thereby evaluating heat cycle resistance in terms of the number of defective packages/number of evaluated packages.

(13) Moisture Resistance Reliability

A semiconductor device prepared by underfilling with the liquid resin composition for electronic components and then curing the composition was treated for 150 hours under the HAST conditions of 130° C. and 85% RH and then examined in a conduction test to examine breaking in an aluminum wiring and a pad, thereby evaluating moisture resistance reliability in terms of the number of defective packages/number of evaluated packages.

Examples 1 to 11 and Comparative Examples 1 to 4

A liquid diepoxy resin having an epoxy equivalent of 160 (epoxy resin 1, jER806 (trade name) manufactured by Japan Epoxy Resins Co., Ltd.) obtained by epoxylation of bisphenol F, and a trifunctional liquid epoxy resin having an epoxy equivalent of 95 (epoxy resin 2, jER630 (trade name) manufactured by Japan Epoxy Resins Co., Ltd.) obtained by epoxylation of aminophenol, were used respectively as the epoxy resin (A).

Diethyl toluene diamine having an active hydrogen equivalent of 45 (liquid amine 1, jER Cure W (trade name) manufactured by Japan Epoxy Resins Co., Ltd.), and diethyl-di-amino-diphenyl methane having an active hydrogen equivalent of 63 (liquid amine 2, Kaya Hard A-A (trade name) manufactured by Nippon Kayaku Co., Ltd.), were used respectively as the curing agent (B).

Tetramethyl-diamino-diphenyl methane having an active hydrogen equivalent of 63 (solid amine, Kaya Bond C-200S (trade name) manufactured by Nippon Kayaku Co., Ltd.) and a liquid acid anhydride having an acid anhydride equivalent of 168 (NH5500 (trade name) manufactured by Hitachi Chemical Co., Ltd.), were used respectively as comparative curing agents.

2-Phenyl-4-methyl-5-hydroxymethylimidazole (hardening accelerator 1), 2-phenyl-4,5-dihydroxymethylimidazole (hardening accelerator 2), 2-phenylimidazole (hardening accelerator 3), and a hardening accelerator wherein a microencapsulated amine was dispersed in bisphenol A epoxy resin and bisphenol F epoxy resin (hardening accelerator 4 with an effective hardening accelerator content of 33% by mass, Novacure HX-3921HP (trade name) manufactured by Asahi Kasei Chemicals Corporation), were used respectively as the hardening accelerator (C).

Out of flexibilizing agents, spherical silicone fine particles having an average particle size of 2 μm having solid dimethyl silicone rubber particles modified thereon with epoxy groups (silicone polymer 1, Torefill E-601 (trade name) manufactured by Dow Corning Toray Silicone Co., Ltd.), and silicone fine particles having an average particle size of 0.12 μm consisting of solid dimethyl silicone as a core layer and an acrylic resin as a shell layer in a core/shell ratio of 2/1 by mass (silicone polymer 2), were used respectively as the silicone polymer particles (E).

NBR particles having an average particle size of 0.19 μm consisting of a butadiene/acrylonitrile/methacrylic acid/divinyl benzene copolymer (XER-91 (trade name) manufactured by JSR Co., Ltd.) were used as comparative polymer particles.

A polyether-modified silicone-based surfactant (surfactant 1, BYK-377 (trade name) manufactured by BYK-Chemie Japan), an aralkyl-modified silicone-based surfactant (surfactant 2, BYK-323 (trade name) manufactured by BYK-Chemie Japan), a silicone-modified epoxy resin (surfactant 3) obtained by heating and melting a phenol-modified silicone having a hydroxyl equivalent of 750 and a weight-average molecular weight of 1600 (BY16-799 (trade name) manufactured by Dow Corning Toray Silicone Co., Ltd.) with a bisphenol F liquid epoxy resin (jER 806 (trade name) manufactured by Japan Epoxy Resins Co., Ltd.) in a weight ratio of 1/1, a silicone-modified epoxy resin (surfactant 4) obtained by heating and melting a phenol-modified silicone having an active hydrogen equivalent of 130 and a weight-average molecular weight of 470 (BY16-871 (trade name) manufactured by Dow Corning Toray Silicone Co., Ltd.) with a bisphenol F liquid epoxy resin (jER 806 (trade name) manufactured by Japan Epoxy Resins Co., Ltd.) in a weight ratio of 1/1, a silicone-modified epoxy resin (surfactant 5) obtained by heating and melting a carbinol-modified silicone having a hydroxyl equivalent of 3500 and a weight-average molecular weight of 8500 (BY16-004 (trade name) manufactured by Dow Corning Toray Silicone Co., Ltd.) with a bisphenol F liquid epoxy resin (jER 806 (trade name) manufactured by Japan Epoxy Resins Co., Ltd.) in a weight ratio of 1/1, and a polyoxyethylene alkyl ether-based surfactant (surfactant 6, Pegnol L-4 (trade name) manufactured by Toho Chemical Industry Co., Ltd.), were used respectively as the nonionic surfactant (F).

γ-Glycidoxypropyltrimethoxysilane (Sila Ace S510 (trade name) manufactured by Chisso Corporation) was used as the coupling agent.

Carbon black (MA-100 (trade name) manufactured by Mitsubishi Chemical Corporation) was used as the colorant.

A bismuth type ion-trapping agent (IXE-500 (trade name) manufactured by Toagosei Co., Ltd.) was used as the ion-trapping agent.

Spherical molten silica having an average particle size of 1 μm was used as the inorganic filler (D).

These components were compounded with one another in compositions as shown in Tables 1 to 3 below, then kneaded and dispersed by a three-roll and vacuum mill to prepare liquid resin compositions for electronic components in Examples 1 to 11 and Comparative Examples 1 to 4. In Table 1 to 3, the amount of each ingredient is shown in parts by mass, and blank columns indicate that the corresponding ingredient was not blended.

TABLE 1

| item | Example 1 | 2 | 3 | 4 | 5 | 6 |
|---|---|---|---|---|---|---|
| epoxy resin 1 | 70 | 70 | 70 | 70 | 60 | 60 |
| epoxy resin 2 | 30 | 30 | 30 | 30 | 40 | 40 |
| liquid amine 1 | 34 | 34 | 34 | 35 | | |
| liquid amine 2 | | | | | 50 | 50 |
| solid amine | | | | | | |
| liquid acid anhydride | | | | | | |
| hardening accelerator 1 | 1 | | | | 1 | |
| hardening accelerator 2 | | 1 | | | | 1 |
| hardening accelerator 3 | | | 1 | | | |
| hardening accelerator 4 | | | | 8 | | |
| silicone polymer 1 | | | | | | |
| Silane coupling agent | 3 | 3 | 3 | 3 | 3.2 | 3.2 |
| colorant | 1 | 1 | 1 | 1 | 1 | 1 |
| ion-trapping agent | 3 | 3 | 3 | 3 | 3 | 3 |
| filler | 213 | 213 | 213 | 226 | 238 | 238 |
| hardening accelerator mass (mass %) | 1 | 1 | 1 | 8 | 1 | 1 |
| filler mass (mass %) | 60 | 60 | 60 | 60 | 60 | 60 | unit: parts by mass

TABLE 2

| Item | Example 7 | 8 | 9 | 10 | 11 |
|---|---|---|---|---|---|
| epoxy resin 1 | 60 | 60 | 70 | 70 | 70 |
| epoxy resin 2 | 40 | 40 | 30 | 30 | 30 |
| liquid amine 1 | | | 34 | 34 | 34 |
| liquid amine 2 | 50 | 52 | | | |
| solid amine | | | | | |
| liquid acid anhydride | | | | | |
| hardening accelerator 1 | | | 0.5 | 2 | 3 |
| hardening accelerator 2 | | | | | |
| hardening accelerator 3 | 1 | | | | |
| hardening accelerator 4 | | 8 | | | |
| silicone polymer 1 | | | | | |
| Silane coupling agent | 3.2 | 3.2 | 3 | 3 | 3 |
| colorant | 1 | 1 | 1 | 1 | 1 |
| ion-trapping agent | 3 | 3 | 3 | 3 | 3 |
| filler | 238 | 251 | 212 | 214 | 216 |
| hardening accelerator mass (mass %) | 1 | 8 | 0.5 | 2 | 3 |
| filler mass (mass %) | 60 | 60 | 60 | 60 | 60 |

Unit: parts by mass

TABLE 3

| item | Comparative Example 1 | 2 | 3 | 4 |
|---|---|---|---|---|
| epoxy resin 1 | 70 | 60 | 70 | 70 |
| epoxy resin 2 | 30 | 40 | 30 | 30 |
| liquid amine 1 | 34 | | | |
| liquid amine 2 | | 50 | | |
| solid amine | | | 47 | |
| liquid acid anhydride | | | | 114 |
| hardening accelerator 1 | | | 1 | 1 |
| hardening accelerator 2 | | | | |
| hardening accelerator 3 | | | | |
| hardening accelerator 4 | | | | |
| silicone polymer 1 | | | | |
| Silane coupling agent | 3 | 3.2 | 3.2 | 4.5 |
| colorant | 1 | 1 | 1 | 1 |
| ion-trapping agent | 3 | 3 | 3 | 3 |
| filler | 211 | 236 | 233 | 335 |
| hardening accelerator mass (mass %) | — | — | 1 | 1 |
| filler mass (mass %) | 60 | 60 | 60 | 60 |

Unit: parts by mass

The evaluation results are shown in Tables 4 to 6 below.

TABLE 4

| | Item | | Example 1 | Example 2 | Example 3 | Example 4 | Example 5 | Example 6 |
|---|---|---|---|---|---|---|---|---|
| Property before curing | Viscosity (Pas) 25° C. | | 12 | 12 | 12 | 15 | 17 | 17 |
| | Gelling time (sec) 165° C. | | 480 | 410 | 526 | 430 | 385 | 320 |
| | Weight loss by heating (mass %) | | 2.7 | 2.6 | 2.9 | 2.1 | 1.8 | 1.6 |
| Property after curing | Tg (° C.) | 130° C./2 hr cure | 100 | 100 | 97 | 105 | 101 | 102 |
| | | 140° C./2 hr cure | 117 | 115 | 110 | 112 | 117 | 115 |
| | | 150° C./2 hr cure | 120 | 119 | 117 | 116 | 121 | 120 |
| | | 165° C./2 hr cure | 120 | 119 | 117 | 116 | 121 | 120 |
| | | 175° C./2 hr cure | 120 | 119 | 117 | 116 | 121 | 120 |
| | SR adhesion | Initial value (MPa) | 20 | 20 | 20 | 22 | 26 | 26 |
| | | HAST 150 h (MPa) | 15 | 15 | 14 | 17 | 21 | 21 |
| | PI adhesion | Initial value (MPa) | 18 | 19 | 20 | 20 | 29 | 29 |
| | | HAST 150 h (MPa) | 10 | 11 | 12 | 13 | 20 | 21 |
| Curing temp of package (time: 2 hr) | | | 150° C. | 150° C. | 150° C. | 150° C. | 150° C. | 150° C. |
| Evaluation results of Non low-k package | Formability | Impregnation time (sec) | 75 | 75 | 75 | 77 | 84 | 85 |
| | | Void | none | none | none | none | none | none |
| | | Chip warpage (μm) | 32 | 33 | 33 | 36 | 28 | 28 |
| | Reliability | Reflow resistance | 0/20 | 0/20 | 0/20 | 0/20 | 0/20 | 0/20 |
| | | Heat cycle resistance | 0/20 | 0/20 | 0/20 | 1/20 | 0/20 | 0/20 |
| | | Moisture resistance | 0/20 | 0/20 | 0/20 | 0/20 | 0/20 | 0/20 |
| Evaluation results of low-k packge | Formability | Impregnation time (sec) | 73 | 73 | 73 | 76 | 82 | 83 |
| | | Void | none | none | none | none | none | none |
| | | Chip warpage (μm) | 30 | 32 | 32 | 35 | 26 | 27 |
| | Reliability | Reflow resistance | 0/20 | 0/20 | 0/20 | 0/20 | 0/20 | 0/20 |
| | | Heat cycle resistance | 0/20 | 0/20 | 0/20 | 1/20 | 0/20 | 0/20 |
| | | Moisture resistance | 0/20 | 0/20 | 1/20 | 0/20 | 0/20 | 0/20 |

TABLE 5

| | Item | | Example 7 | Example 8 | Example 9 | Example 10 | Example 11 |
|---|---|---|---|---|---|---|---|
| Property before curing | Viscosity (Pas) 25° C. | | 17 | 19 | 12 | 14 | 17 |
| | Gelling time (sec) 165° C. | | 422 | 350 | 605 | 305 | 190 |
| | Weight loss by heating (mass %) | | 1.9 | 1.4 | 3.0 | 2.1 | 2.0 |
| Property after curing | Tg (° C.) | 130° C./2 hr cure | 100 | 106 | 98 | 118 | 115 |
| | | 140° C./2 hr cure | 112 | 113 | 106 | 118 | 115 |
| | | 150° C./2 hr cure | 118 | 116 | 115 | 118 | 115 |
| | | 165° C./2 hr cure | 118 | 116 | 120 | 118 | 115 |
| | | 175° C./2 hr cure | 118 | 116 | 120 | 119 | 115 |
| | SR adhesion | Initial value (MPa) | 26 | 27 | 20 | 20 | 18 |
| | | HAST 150 h (MPa) | 20 | 23 | 15 | 12 | 11 |
| | PI adhesion | Initial value (MPa) | 30 | 30 | 18 | 18 | 16 |
| | | HAST 150 h (MPa) | 21 | 22 | 11 | 8 | 5 |
| Curing temp of package (time: 2 hr) | | | 150° C. | 150° C. | 165° C. | 130° C. | 130° C. |
| Evaluation results of Non low-k package | Formability | Impregnation time (sec) | 85 | 89 | 75 | 76 | 79 |
| | | Void | none | none | none | none | none |
| | | Chip warpage (μm) | 31 | 30 | 35 | 26 | 25 |
| | Reliability | Reflow resistance | 0/20 | 0/20 | 0/20 | 0/20 | 0/20 |
| | | Heat cycle resistance | 0/20 | 1/20 | 0/20 | 0/20 | 0/20 |
| | | Moisture resistance | 0/20 | 0/20 | 0/20 | 0/20 | 1/20 |

TABLE 5-continued

| | | | Example | | | | |
|---|---|---|---|---|---|---|---|
| | Item | | 7 | 8 | 9 | 10 | 11 |
| Evaluation results of low-k packge | Formability | Impregnation time (sec) | 83 | 86 | 73 | 73 | 76 |
| | | Void | none | none | none | none | none |
| | | Chip warpage (μm) | 32 | 29 | 35 | 24 | 23 |
| | Reliability | Reflow resistance | 0/20 | 0/20 | 0/20 | 0/20 | 0/20 |
| | | Heat cycle resistance | 0/20 | 1/20 | 1/20 | 0/20 | 2/20 |
| | | Moisture resistance | 0/20 | 0/20 | 0/20 | 0/20 | 2/20 |

TABLE 6

| | | | Comparative Example | | | |
|---|---|---|---|---|---|---|
| | Item | | 1 | 2 | 3 | 4 |
| Property before curing | Viscosity (Pas) 25° C. | | 12 | 17 | 36 | 6 |
| | Gelling time (sec) 165° C. | | 810 | 705 | 330 | 230 |
| | Weight loss by heating (mass %) | | 4.1 | 3.2 | 2.8 | 2.6 |
| Property after curing | Tg (° C.) | 130° C./2 hr cure | 100 | 98 | 100 | 105 |
| | | 140° C./2 hr cure | 105 | 103 | 110 | 114 |
| | | 150° C./2 hr cure | 115 | 115 | 122 | 130 |
| | | 165° C./2 hr cure | 120 | 122 | 122 | 130 |
| | | 175° C./2 hr cure | 120 | 122 | 122 | 130 |
| | SR adhesion | Initial value (MPa) | 18 | 25 | 27 | 31 |
| | | HAST 150 h (MPa) | 9 | 13 | 20 | 4 |
| | PI adhesion | Initial value (MPa) | 15 | 28 | 23 | 22 |
| | | HAST 150 h (MPa) | 5 | 16 | 19 | 3 |
| Curing temp of package (time: 2 hr) | | | 165° C. | 165° C. | 150° C. | 150° C. |
| Evaluation results of Non low-k package | Formability | Impregnation time (sec) | 75 | 110 | 243 | 68 |
| | | Void | exist | exist | exist | none |
| | | Chip warpage (μm) | 40 | 38 | 32 | 30 |
| | Reliability | Reflow resistance | 0/20 | 0/20 | 0/20 | 13/20 |
| | | Heat cycle resistance | 7/20 | 5/20 | 5/20 | 12/20 |
| | | Moisture resistance | 6/20 | 0/20 | 0/20 | 19/20 |
| Evaluation results of low-k packge | Formability | Impregnation time (sec) | 75 | 112 | 250 | 65 |
| | | Void | exist | exist | exist | none |
| | | Chip warpage (μm) | 42 | 39 | 32 | 29 |
| | Reliability | Reflow resistance | 3/20 | 0/20 | 0/20 | 17/20 |
| | | Heat cycle resistance | 12/20 | 8/20 | 8/20 | 18/20 |
| | | Moisture resistance | 11/20 | 0/20 | 0/20 | 20/20 |

The compositions in Comparative Examples 1 and 2 wherein the hardening accelerator as the component (C) in the present invention was not contained, had voids because the gelling time was long and the weight loss by heating was high. The curing temperature determined from Tg change after 2 hours of curing was high and thus the chip warpage of the package was increased resulting in a significant deterioration in heat cycle resistance. The composition in Comparative Example 3 wherein the hardening accelerator as the component (C) was contained and the curing agent was a solid amine, had high viscosity to increase the impregnation time thus deteriorating productivity, and voids caused a deterioration in moisture resistance reliability and thermal shock resistance. The composition in Comparative Example 4 wherein the hardening accelerator as the component (C) was contained and the curing agent was a liquid acid anhydride that is not a liquid aromatic amine, was excellent in formability but was poor in moisture-resistant adhesion and was thus significantly inferior in reflow resistance, heat cycle resistance and moisture resistance reliability. On the other hand, the compositions in Examples 1 to 11 had no voids during forming because the gelling time was short and the weight loss by heating was suppressed at low level, and because the curing temperature could be set low, the chip warpage was low, and these compositions had improved adhesiveness after the HAST treatment and were thus excellent in reliability such as in reflow resistance, heat cycle resistance and moisture resistance.

Examples 12 to 18 and Comparative Examples 5 to 8

The liquid resin compositions for electronic components in Examples 12 to 18 and Comparative Examples 5 to 8 were prepared in the same manner as described above except that the compositions shown in Tables 7 and 8 were used respectively.

TABLE 7

| item | \multicolumn{7}{c}{Example} |
|---|---|---|---|---|---|---|---|
| | 12 | 13 | 14 | 15 | 16 | 17 | 18 |
| epoxy resin 1 | 70 | 70 | 70 | 70 | 70 | 70 | 70 |
| epoxy resin 2 | 30 | 30 | 30 | 30 | 30 | 30 | 30 |
| liquid amine 1 | 34 | 34 | — | — | 34 | 34 | 34 |
| liquid amine 2 | — | — | 48 | 48 | — | — | — |
| solid amine | — | — | — | — | — | — | — |
| liquid acid anhydride | — | — | — | — | — | — | — |
| hardening accelerator 1 | — | — | — | — | 1 | — | — |
| silane coupling agent | 3 | 3 | 3.5 | 3.5 | 3 | 3 | 3.5 |
| carbon black | 1 | 1 | 1 | 1 | 1 | 1 | 1 |
| ion-trapping agent | 3 | 3 | 3 | 3 | 3 | 3 | 3 |
| silicone polymer 1 | 10 | — | 10 | — | 10 | 3 | 36 |
| silicone polymer 2 | — | 10 | — | 10 | — | — | — |
| NBR particles | — | — | — | — | — | — | — |
| blend amount (mass %) | 6.6 | 6.6 | 6.1 | 6.1 | 6.6 | 2.1 | 20 |
| filler | 225 | 225 | 250 | 250 | 225 | 220 | 268 |
| blend amount (mass %) | 60 | 60 | 60 | 60 | 60 | 60 | 60 |

Unit: parts by mass

TABLE 8

| item | \multicolumn{4}{c}{Comparative Example} |
|---|---|---|---|---|
| | 5 | 6 | 7 | 8 |
| epoxy resin 1 | 70 | 70 | 70 | 70 |
| epoxy resin 2 | 30 | 30 | 30 | 30 |
| liquid amine 1 | 34 | 34 | — | — |
| liquid amine 2 | — | — | — | — |
| solid amine | — | — | 48 | — |
| liquid acid anhydride | — | — | — | 110 |
| hardening accelerator 1 | — | — | — | 1 |
| silane coupling agent | 3 | 3 | 3.5 | 5 |
| carbon black | 1 | 1 | 1 | 1 |
| ion-trapping agent | 3 | 3 | 3 | 3 |
| silicone polymer 1 | — | — | 10 | 15 |
| silicone polymer 2 | — | — | — | — |
| NBR particles | — | 10 | — | — |
| blend amount (mass %) | — | 6.6 | 6.1 | 6.4 |
| filler | | 225 | 250 | 355 |
| blend amount (mass %) | 60 | 60 | 60 | 60 |

Unit: parts by mass

The various evaluation results are shown in Tables 9 and 10.

TABLE 9

| | Item | | \multicolumn{7}{c}{Example} |
|---|---|---|---|---|---|---|---|---|---|
| | | | 12 | 13 | 14 | 15 | 16 | 17 | 18 |
| Property before curing | Viscosity (Pas) 25° C. | | 16 | 15 | 20 | 19 | 17 | 13 | 26 |
| | thixotropic index | | 0.88 | 0.85 | 0.88 | 0.83 | 0.84 | 0.88 | 0.84 |
| Property after curing | Elastic modulus (Gpa) 25° C. | | 8.5 | 8.4 | 8.7 | 8.6 | 8.7 | 8.9 | 7.8 |
| | SR adhesion | Initial value (MPa) | 28 | 30 | 33 | 31 | 34 | 27 | 29 |
| | | HAST 150 h (Mpa) | 27 | 29 | 30 | 28 | 30 | 25 | 27 |
| | PI adhesion | Initial value (MPa) | 27 | 26 | 33 | 30 | 25 | 29 | 31 |
| | | HAST 150 h (Mpa) | 23 | 22 | 26 | 25 | 22 | 23 | 25 |
| Evaluation results of Non low-k package | Formability | Impregnation time (sec) | 86 | 84 | 94 | 90 | 91 | 81 | 122 |
| | | Void | none | none | none | none | none | none | none |
| | Reliability | Reflow resistance | 0/20 | 0/20 | 0/20 | 0/20 | 0/20 | 0/20 | 0/20 |
| | | Heat cycle resistance | 0/20 | 0/20 | 0/20 | 0/20 | 0/20 | 0/20 | 0/20 |
| | | Moisture resistance | 0/20 | 0/20 | 0/20 | 0/20 | 0/20 | 0/20 | 0/20 |
| Evaluation results of low-k package | Formability | Impregnation time (sec) | 83 | 85 | 92 | 93 | 92 | 82 | 118 |
| | | Void | none | none | none | none | none | none | none |
| | Reliability | Reflow resistance | 0/20 | 0/20 | 0/20 | 0/20 | 0/20 | 0/20 | 0/20 |
| | | Heat cycle resistance | 0/20 | 0/20 | 0/20 | 0/20 | 0/20 | 2/20 | 0/20 |
| | | Moisture resistance | 0/20 | 0/20 | 0/20 | 0/20 | 0/20 | 0/20 | 0/20 |

TABLE 10

| | | Comparative Example | | | |
|---|---|---|---|---|---|
| Item | | 5 | 6 | 7 | 8 |
| Property before curing | Viscosity (Pas) 25° C. | 12 | 24 | 41 | 10 |
| | thixotropic index | 0.85 | 0.92 | 1.08 | 1.02 |
| Property after curing | Elastic modulus (GPa) 25° C. | 9.5 | 9.1 | 8.8 | 10.1 |
| | SR adhesion Initial value (MPa) | 18 | 26 | 27 | 31 |
| | SR adhesion HAST 150 h (MPa) | 9 | 13 | 20 | 4 |
| | PI adhesion Initial value (MPa) | 15 | 30 | 23 | 22 |
| | PI adhesion HAST 150 h (MPa) | 5 | 16 | 19 | 3 |
| Evaluation results of Non low-k package | Formability Impregnation time (sec) | 75 | 110 | 243 | 68 |
| | Void | exist | exist | exist | none |
| | Reliability Reflow resistance | 0/20 | 0/20 | 0/20 | 13/20 |
| | Heat cycle resistance | 7/20 | 0/20 | 2/20 | 0/20 |
| | Moisture resistance | 6/20 | 3/20 | 4/20 | 14/20 |
| Evaluation results of low-k packge | Formability Impregnation time (sec) | 77 | 108 | 250 | 65 |
| | Void | exist | exist | exist | none |
| | Reliability Reflow resistance | 3/20 | 0/20 | 2/20 | 17/20 |
| | Heat cycle resistance | 12/20 | 3/20 | 9/20 | 2/20 |
| | Moisture resistance | 11/20 | 4/20 | 3/20 | 18/20 |

The composition in Comparative Example 5 wherein the silicone polymer as the component (E) in the present invention was not contained, was significantly inferior in moisture-resistant adhesion, moisture resistance reliability and thermal shock resistance. The composition in Comparative Example 6 wherein NBR particles were compounded as the flexibilizing agent in place of the component (E), had an improvement effect on moisture-resistant adhesion and thermal shock resistance, but was still unsatisfactory. The composition in Comparative Example 7 wherein the silicone polymer as the component (E) was contained but the curing agent was a solid amine, had high viscosity to increase the impregnation time thus deteriorating productivity, and voids caused a deterioration in moisture resistance reliability and thermal shock resistance. The composition in Comparative Example 8 wherein the silicone polymer as the component (E) was contained but the curing agent was a liquid acid anhydride in place of the liquid aromatic amine, was excellent in formability but was poor in moisture-resistant adhesion and was thus significantly inferior in reflow resistance and moisture resistance reliability. On the other hand, the compositions in Examples 12 to 18 wherein the liquid aromatic amine and the silicone polymer particles (E) were compounded, were excellent in impregnation during forming, were free of void generation, were excellent in adhesiveness in an early stage and during humidification and were thus observed to have a significant improvement effect on reliability such as in moisture resistance reliability and thermal shock resistance.

Examples 19 to 31 and Comparative Examples 9 to 14

The liquid resin compositions for electronic components in Examples 19 to 31 and Comparative Examples 9 to 14 were prepared in the same manner as described above except that the compositions shown in Tables 11 to 13 were used respectively.

TABLE 11

| | Example | | | | | |
|---|---|---|---|---|---|---|
| Item | 19 | 20 | 21 | 22 | 23 | 24 |
| epoxy resin 1 | 70 | 70 | 70 | 60 | 60 | 60 |
| epoxy resin 2 | 30 | 30 | 30 | 40 | 40 | 40 |
| liquid amine 1 | 34 | 34 | 34 | | | |
| liquid amine 2 | | | | 50 | 50 | 50 |
| solid amine | | | | | | |
| liquid acid anhydride | | | | | | |
| surfactant 1 | 1 | | | 1 | | |
| surfactant 2 | | 1 | | | 1 | |
| surfactant 3 | | | 1 | | | 1 |
| surfactant 4 | | | | | | |
| surfactant 5 | | | | | | |
| surfactant 6 | | | | | | |
| silicone polymer 1 | | | | | | |
| hardening accelerator 1 | | | | | | |
| Silane coupling agent | 3 | 3 | 3 | 3 | 3 | 3 |
| colorant | 1 | 1 | 1 | 1 | 1 | 1 |
| ion-trapping agent | 3 | 3 | 3 | 3 | 3 | 3 |
| filler | 213 | 213 | 213 | 238 | 238 | 238 |
| surfactant mass (mass %) | 0.28 | 0.28 | 0.28 | 0.25 | 0.25 | 0.25 |
| filler mass (mass %) | 60 | 60 | 60 | 60 | 60 | 60 |

Unit: parts by mass

TABLE 12

| | Example | | | | | | |
|---|---|---|---|---|---|---|---|
| Item | 25 | 26 | 27 | 28 | 29 | 30 | 31 |
| epoxy resin 1 | 70 | 70 | 70 | 70 | 70 | 70 | 70 |
| epoxy resin 2 | 30 | 30 | 30 | 30 | 30 | 30 | 30 |
| liquid amine 1 | 34 | 34 | 34 | 34 | 34 | 34 | 34 |
| liquid amine 2 | | | | | | | |
| solid amine | | | | | | | |
| liquid acid anhydride | | | | | | | |
| surfactant 1 | | | | | | | |
| surfactant 2 | | | | | | | |
| surfactant 3 | 0.3 | 2.5 | 4.0 | 1 | | | |
| surfactant 4 | | | | | 1 | | |
| surfactant 5 | | | | | | 1 | |
| surfactant 6 | | | | | | | 1 |

TABLE 12-continued

|  | Example | | | | | | |
|---|---|---|---|---|---|---|---|
| Item | 25 | 26 | 27 | 28 | 29 | 30 | 31 |
| silicone polymer 1 |  |  |  | 10 |  |  |  |
| hardening accelerator 1 |  |  |  |  |  |  |  |
| Silane coupling agent | 3 | 3 | 3 | 3 | 3 | 3 | 3 |
| colorant | 1 | 1 | 1 | 1 | 1 | 1 | 1 |
| ion-trapping agent | 3 | 3 | 3 | 3 | 3 | 3 | 3 |
| filler | 212 | 215 | 217 | 228 | 213 | 213 | 213 |
| surfactant mass (mass %) | 0.08 | 0.70 | 1.10 | 0.26 | 0.28 | 0.28 | 0.28 |
| filler mass (mass %) | 60 | 60 | 60 | 60 | 60 | 60 | 60 |

Unit: parts by mass

TABLE 13

|  | Comparative Example | | | | | |
|---|---|---|---|---|---|---|
| Item | 9 | 10 | 11 | 12 | 13 | 14 |
| epoxy resin 1 | 70 | 60 | 70 | 70 | 70 | 70 |
| epoxy resin 2 | 30 | 40 | 30 | 30 | 30 | 30 |
| liquid amine 1 | 34 |  |  |  |  |  |
| liquid amine 2 |  | 50 |  |  |  |  |
| solid amine |  |  | 47 |  | 47 |  |
| liquid acid anhydride |  |  |  | 114 |  | 114 |
| surfactant 1 |  |  |  |  |  |  |
| surfactant 2 |  |  |  |  |  |  |
| surfactant 3 |  |  |  |  | 1 | 1 |
| surfactant 4 |  |  |  |  |  |  |
| surfactant 5 |  |  |  |  |  |  |
| surfactant 6 |  |  |  |  |  |  |
| silicone polymer 1 |  |  |  |  |  |  |
| hardening accelerator 1 |  |  |  | 1 |  | 1 |
| Silane coupling agent | 3 | 3.2 | 3.2 | 4.6 | 3.2 | 4.6 |
| colorant | 1 | 1 | 1 | 1 | 1 | 1 |
| ion-trapping agent | 3 | 3 | 3 | 3 | 3 | 3 |
| filler | 211 | 236 | 232 | 335 | 233 | 337 |
| surfactant mass (mass %) | — | — | — | — | 0.26 | 0.18 |
| filler mass (mass %) | 60 | 60 | 60 | 60 | 60 | 60 |

Unit: parts by mass

The various evaluation results are shown in Tables 14 to 16.

TABLE 14

|  |  |  | Example | | | | | |
|---|---|---|---|---|---|---|---|---|
| Item |  |  | 19 | 20 | 21 | 22 | 23 | 24 |
| Property before curing | Viscosity (Pas) 25° C. |  | 12 | 12 | 12 | 17 | 17 | 17 |
|  | Surface tension (mN/m) |  | 27 | 26 | 25 | 26 | 26 | 25 |
| Property after curing | SR adhesion | Initial value (MPa) | 20 | 21 | 20 | 26 | 25 | 26 |
|  |  | HAST 150 h (MPa) | 18 | 18 | 19 | 24 | 23 | 24 |
|  | PI adhesion | Initial value (MPa) | 18 | 18 | 17 | 29 | 30 | 30 |
|  |  | HAST 150 h (MPa) | 16 | 15 | 15 | 26 | 27 | 27 |
| Evaluation results of Non low-k package | Formability | Impregnation time (sec) | 79 | 81 | 80 | 87 | 88 | 87 |
|  |  | Void | none | none | none | none | none | none |
|  | Reliability | Reflow resistance | 0/20 | 0/20 | 0/20 | 0/20 | 0/20 | 0/20 |
|  |  | Heat cycle resistance | 0/20 | 0/20 | 0/20 | 0/20 | 0/20 | 0/20 |
|  |  | Moisture resistance | 0/20 | 0/20 | 0/20 | 0/20 | 0/20 | 0/20 |
| Evaluation results of low-k packge | Formability | Impregnation time (sec) | 80 | 82 | 80 | 86 | 87 | 86 |
|  |  | Void | none | none | none | none | none | none |
|  | Reliability | Reflow resistance | 0/20 | 0/20 | 0/20 | 0/20 | 0/20 | 0/20 |
|  |  | Heat cycle resistance | 0/20 | 0/20 | 0/20 | 0/20 | 0/20 | 0/20 |
|  |  | Moisture resistance | 0/20 | 0/20 | 0/20 | 0/20 | 0/20 | 0/20 |

TABLE 15

| | Item | | Example 25 | 26 | 27 | 28 | 29 | 30 | 31 |
|---|---|---|---|---|---|---|---|---|---|
| Property before curing | Viscosity (Pas) 25° C. | | 12 | 11 | 10 | 16 | 12 | 13 | 12 |
| | Surface tension (mN/m) | | 30 | 23 | 22 | 24 | 30 | 29 | 30 |
| Property after curing | SR adhesion | Initial value (MPa) | 20 | 26 | 16 | 28 | 19 | 19 | 20 |
| | | HAST 150 h (MPa) | 15 | 22 | 8 | 27 | 16 | 14 | 8 |
| | PI adhesion | Initial value (MPa) | 17 | 29 | 15 | 27 | 15 | 15 | 18 |
| | | HAST 150 h (MPa) | 13 | 25 | 7 | 23 | 11 | 8 | 12 |
| Evaluation results of Non low-k package | Formability | Impregnation time (sec) | 77 | 82 | 82 | 85 | 78 | 83 | 77 |
| | | Void | none | none | none | none | none | none | none |
| | Reliability | Reflow resistance | 0/20 | 0/20 | 0/20 | 0/20 | 0/20 | 0/20 | 0/20 |
| | | Heat cycle resistance | 0/20 | 0/20 | 0/20 | 0/20 | 0/20 | 0/20 | 0/20 |
| | | Moisture resistance | 0/20 | 0/20 | 0/20 | 0/20 | 0/20 | 1/20 | 1/20 |
| Evaluation results of low-k packge | Formability | Impregnation time (sec) | 78 | 84 | 84 | 86 | 78 | 85 | 78 |
| | | Void | none | none | none | none | none | none | none |
| | Reliability | Reflow resistance | 0/20 | 0/20 | 0/20 | 0/20 | 0/20 | 0/20 | 0/20 |
| | | Heat cycle resistance | 0/20 | 0/20 | 0/20 | 0/20 | 0/20 | 0/20 | 0/20 |
| | | Moisture resistance | 0/20 | 0/20 | 1/20 | 0/20 | 1/20 | 2/20 | 1/20 |

TABLE 16

| | Item | | Comparative Example 9 | 10 | 11 | 12 | 13 | 14 |
|---|---|---|---|---|---|---|---|---|
| Property before curing | Viscosity (Pas) 25° C. | | 12 | 17 | 36 | 6 | 36 | 6 |
| | Surface tension (mN/m) | | 38 | 39 | 41 | 40 | 35 | 36 |
| Property after curing | SR adhesion | Initial value (MPa) | 18 | 25 | 24 | 26 | 24 | 26 |
| | | HAST 150 h (MPa) | 9 | 13 | 15 | 5 | 17 | 7 |
| | PI adhesion | Initial value (MPa) | 15 | 28 | 27 | 30 | 27 | 30 |
| | | HAST 150 h (MPa) | 5 | 16 | 18 | 6 | 19 | 9 |
| Evaluation results of Non low-k package | Formability | Impregnation time (sec) | 75 | 82 | 202 | 60 | 215 | 64 |
| | | Void | exist | exist | exist | none | exist | none |
| | Reliability | Reflow resistance | 0/20 | 0/20 | 0/20 | 15/20 | 0/20 | 15/20 |
| | | Heat cycle resistance | 7/20 | 5/20 | 5/20 | 11/20 | 4/20 | 11/20 |
| | | Moisture resistance | 6/20 | 3/20 | 4/20 | 19/20 | 4/20 | 18/20 |
| Evaluation results of low-k packge | Formability | Impregnation time (sec) | 77 | 81 | 220 | 61 | 226 | 65 |
| | | Void | exist | exist | exist | none | exist | none |
| | Reliability | Reflow resistance | 3/20 | 0/20 | 2/20 | 19/20 | 2/20 | 18/20 |
| | | Heat cycle resistance | 12/20 | 8/20 | 8/20 | 18/20 | 6/20 | 16/20 |
| | | Moisture resistance | 11/20 | 4/20 | 4/20 | 20/20 | 2/20 | 18/20 |

The compositions in Comparative Examples 9 and 10 wherein the surfactant as the component (F) in the present invention was not contained, had high surface tension and were significantly inferior in adhesion after the HAST treatment, in suppression of void formation, in moisture resistance reliability and in heat cycle resistance. The composition in Comparative Example 13 wherein the surfactant as the component (F) was contained but the curing agent was a solid amine, and the composition in Comparative Example 11 wherein the surfactant as the component (F) was not contained and the curing agent was a solid amine, had high viscosity to increase the impregnation time thus deteriorating productivity, and voids caused a deterioration in moisture resistance reliability and thermal shock resistance. The composition in Comparative Example 14 wherein the surfactant as the component (F) was contained but the curing agent was a liquid acid anhydride, and the composition in Comparative Example 12 wherein the surfactant as the component (F) was not contained and the curing agent was a liquid acid anhydride, were excellent in formability but were poor in moisture-resistant adhesion, and were thus significantly inferior in reflow resistance, heat cycle resistance, and moisture resistance reliability. The compositions in Examples 19 to 31, on the other hand, had low surface tension, did not generate voids during forming, had improved adhesiveness after the HAST treatment, and were excellent in reliability such as in reflow resistance, heat cycle resistance, and moisture resistance.

INDUSTRIAL APPLICABILITY

The liquid resin composition for electronic components according to the present invention can achieve reduction in surface tension or reduction in gelling time thereby enabling void generation to be suppressed during forming and simultaneously enabling curing temperature to be lowered. The adhesion of the composition even after moisture absorption to various base materials is high. Further, the composition of the present invention is excellent in formability such as impregnation property, and in reliability such as moisture resistance reliability and thermal shock resistance. This liquid resin composition for electronic components can be used in sealing an electronic component to give an electronic component device excellent in reliability with less chip warpage even for the state-of-the-art semiconductor element, and thus its industrial value is high.

The invention claimed is:

1. A liquid resin composition for electronic components which is used in sealing of electronic components, comprising (A) a liquid epoxy resin, (B) a curing agent containing a liquid aromatic amine, (F) a nonionic surfactant which is a silicone-modified epoxy resin that is liquid at ordinary temperature and is obtained by the reaction of an epoxy resin with an organosiloxane having a functional group reacting with an epoxy group, and (D) an inorganic filler.

2. The liquid resin composition for electronic components according to claim 1, wherein the organsiloxane has a weight-average molecular weight of 500 to 5000.

3. The liquid resin composition for electronic components according to claim 1 or 2, which is used in an electronic component device having an electronic component to be bump-bonded directly onto a wiring substrate.

4. The liquid resin composition for electronic components according to claim 3, wherein the bump is lead-free metal.

5. The liquid resin composition for electronic components according to claim 3, wherein the long side of the electronic component is 5 mm or more in length, and the distance between a wiring substrate constituting the electronic component device and the bump-connected surface of the electronic component is 80 μm or less.

6. The liquid resin composition for electronic components according to claim 3, wherein the long side of the electronic component is 5 mm or more in length, and the electronic component is a semiconductor element having a dielectric layer with a dielectric constant of 3.0 or less.

7. The liquid resin composition for electronic components according to claim 1, wherein the functional group reacting with an epoxy group is one or more groups selected from carboxyl groups, hydroxyl groups, phenolic hydroxyl groups, and mercapto groups, and wherein the organosiloxane has one or more functional groups in one molecule.

8. The liquid resin composition for electronic components according to claim 1, wherein the nonionic surfactant as the component (F) is a silicone-modified epoxy resin obtained by the reaction of organosiloxane with an epoxy resin selected from the group consisting of bisphenol A epoxy resin, bisphenol F epoxy resin, and bisphenol AD epoxy resin.

9. The liquid resin composition for electronic components according to claim 1, further comprising (E) silicone polymer particles.

10. The liquid resin composition for electronic components according to claim 9, wherein the primary particles size of the silicone polymer particles as the component (E) is 0.05 to 10 μm.

* * * * *